United States Patent
Suzuki et al.

(10) Patent No.: US 7,902,922 B2
(45) Date of Patent: Mar. 8, 2011

(54) FEEDFORWARD AMPLIFIER AND CONTROL METHOD THEREOF

(75) Inventors: Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 48 days.

(21) Appl. No.: 12/372,969

(22) Filed: Feb. 18, 2009

(65) Prior Publication Data
US 2009/0315622 A1    Dec. 24, 2009

(30) Foreign Application Priority Data
Feb. 20, 2008    (JP) .................. 2008-038418

(51) Int. Cl.
H03F 1/00    (2006.01)
(52) U.S. Cl. ......................................... 330/151
(58) Field of Classification Search .............. 330/52, 330/151, 295, 302
See application file for complete search history.

(56) References Cited

U.S. PATENT DOCUMENTS

| | | | |
|---|---|---|---|
| 4,772,856 A * | 9/1988 | Nojima et al. ................ | 330/251 |
| 5,815,036 A | 9/1998 | Yoshikawa et al. | |
| 6,320,464 B1 | 11/2001 | Suzuki et al. | |
| 6,756,844 B2 * | 6/2004 | Nanao et al. ................. | 330/149 |

FOREIGN PATENT DOCUMENTS

| | | |
|---|---|---|
| EP | 1 041 712 A2 | 10/2000 |
| JP | 63-153904 | 6/1988 |

OTHER PUBLICATIONS

Steve C. Cripps, "Advanced Techniques in RF Power Amplifier Design", Artech House, Chapter 2 and 6, 2002, 54 pages.
Kyoung-Joon Cho, et al., "A Highly Efficient Doherty Feedforward Linear Power Amplifier for W-CDMA Base-Station Applications", IEEE Transactions on Microwave Theory and Techniques, vol. 53, No. 1. Jan. 2005, 9 pages.
S. Nishiki, et al., "Harmonic Reaction Amplifier—A Novel High-Efficiency and High-Power Microwave Amplifier—", IEEE MTT-S Digest, No. DD-5, 1987, 4 pages.
T. Nojima, et al., "High Efficiency Microwave Harmonic Reaction Amplifier", IEEE MTT-S Digest, No. LL-3, 1988, 4 pages.
Shoichi Narahashi, et al., "Extremely Low-Distortion Multi-Carrier Amplifier—Self-Adjusting Feed-Forward (SAFF) Amplifier—" IEEE ICC '91, 1991, 6 pages.
Nick Pothecary, "Feedforward Linear Power Amplifiers", Artech House, Chapter 5, 1999, 26 pages.
Frederick H. Raab, et al., "Power Amplifiers and Transmitters for RF and Microwave", IEEE Transactions on Microwave Theory and Techniques, vol. 50, No. 3, Mar. 2002, 13 pages.

(Continued)

Primary Examiner — Robert Pascal
Assistant Examiner — Khiem D Nguyen
(74) Attorney, Agent, or Firm — Oblon, Spivak, McClelland, Maier & Neustadt, L.L.P.

(57) ABSTRACT

In a feedforward amplifier (200) including a signal cancellation circuit (10) and a distortion eliminating circuit (20), a harmonic reaction amplifier (130) is used as a main amplifier of the signal cancellation circuit. A controller (43) obtains an adjacent channel leakage power ratio (ACLR) and a power efficiency from an output of the feedforward amplifier (200) and controls the gate bias voltages of two transistors (33A and 33B) of the harmonic reaction amplifier (130) to maximize the power efficiency under the condition that the ACLR is less than or equal to a reference value.

7 Claims, 13 Drawing Sheets

OTHER PUBLICATIONS

Yasushi Yamao, et al., "Performance of π/4-QPSK Transmission for Digital Mobile Radio Applications", IEEE,19891127, 19891127-19891130, XP010083862, Nov. 27, 1989, pp. 443-447.

Toshio Nojima, et al., "Circuit Technology for Mobile/Personal Communications", European Microwave Conference, IEEE, XP031066042, Oct. 1, 1994, pp. 220-229.

Office Action issued Aug. 27, 2010, in Korean Patent Application No. 10-2009-0013288 (with English translation).

Office Action issued Dec. 21, 2010; for Chinese Patent Application No. 200910004969.5 (with English-language translation).

* cited by examiner

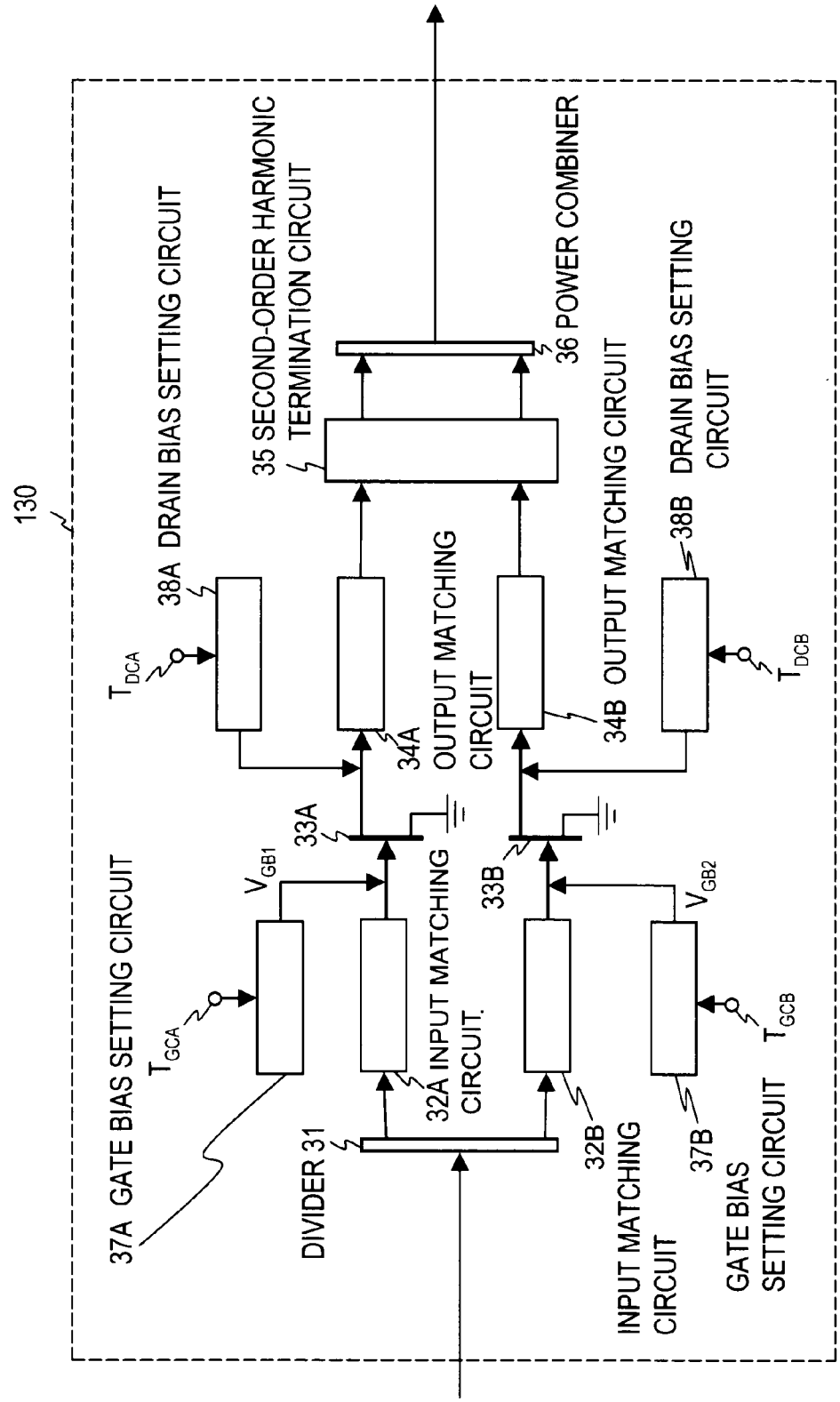

FEEDFORWARD AMPLIFIER AND CONTROL METHOD THEREOF

BACKGROUND OF THE INVENTION

1. Field of the Invention

The present invention relates to a highly efficient feedforward amplifier and a control method thereof.

2. Description of the Related Art

In order to provide coverage areas to keep up with the rapid spread of mobile communications in these years, many base station equipment need to be installed. Some base station equipment need to be installed in the same location of the existing base station for installation reasons. On the other hand, there is a demand for reduction of power consumption of base station equipment. In these circumstances, there is a growing need for miniaturization and lower power consumption of base station equipment. Base station equipment typically includes devices such as modulator and demodulator, transmitter amplifier, heatsinks, and various controllers. Since the part in the base station equipment that consumes the majority of the power is the transmitter amplifier, there has been a focus of attention in regard to reduction of power consumption of the transmitter amplifier.

The transmitter amplifier in the base station equipment uses a linearization technique because of (1) the need for simultaneous amplification of multiple carriers and (2) the need for meeting standard values such as an adjacent channel leakage power required in a mobile communication standard. A feedforward amplifier is known as an amplifier employing linearization technique. FIG. 1 shows a basic configuration of a feedforward amplifier. The feedforward amplifier 100 includes a signal cancellation circuit 10 and a distortion eliminating circuit 20 (Non-patent literature 1).
Non-patent literature 1: N. Pothecary, Feedforward linear power amplifiers, Artech House, 1999.

The signal cancellation circuit 10 includes a divider 11 which distributes a signal input in the feedforward amplifier 100 into two paths, a vector adjuster 12, a main amplifier 13, a delay line 14, and a combiner/divider 15. A path including the vector adjuster 12 and the main amplifier 13 is a main amplifier path $P_{MA}$ and a path including the delay line 14 is a linear transfer path $P_{LT}$. The combiner/divider 15 is typically implemented by a directional coupler and has a degree of coupling equivalent to the gain of the main amplifier path $P_{MA}$.

The main amplifier 13 amplifies an output signal from the vector adjuster 12. The combiner/divider 15 combines an output signal (here, a signal consisting of a main wave component which is an input signal of the feedforward amplifier and a distortion component generated by the main amplifier) from the main amplifier path $P_{MA}$ and an output signal from the linear transfer path $P_{LT}$. The vector adjuster 12 adjusts the amplitude and phase of an input signal of the main amplifier 13 so that the amount of the distortion component output to a distortion injection path $P_{DI}$ described below becomes sufficiently large (the adjustment is referred to as loop adjustment of the signal cancellation circuit 10). A signal extracting unit and a controller required for loop adjustment of the signal cancellation circuit 10 are not shown. The distortion component is an input signal of the distortion injection path $P_{DI}$. The combiner/divider 15 outputs the main wave component and the distortion component to the other path of the distortion eliminating circuit 20 (the main amplifier output transfer path $P_{MT}$, which will be described later).

The distortion eliminating circuit 20 includes a delay line 21, a vector adjuster 22, an auxiliary amplifier 23, and a power combiner 24. A path including the delay line 21 is a main amplifier output transfer path $P_{MT}$ and a path including the vector adjuster 22 and the auxiliary amplifier 23 is a distortion injection path $P_{DI}$. The vector adjuster 22 adjusts the amplitude and phase of the distortion component input in the distortion injection path $P_{DI}$ so that the adjacent channel leakage power ratio (ACLR) of an output signal of the power combiner 24, which will be described later, becomes sufficiently small (the adjustment is referred to as loop adjustment of the distortion eliminating circuit 20). A signal extracting unit and a controller required for the loop adjustment of the distortion eliminating circuit 20 are not shown. The auxiliary amplifier 23 amplifies an output signal of the vector adjuster 22. The power combiner 24 combines an output signal of the main amplifier output transfer path $P_{MT}$ and an output signal of the distortion injection path $P_{DI}$ with equal amplitudes, opposite phases, and equal delays. As a result, the distortion component is eliminated and the main wave component is output from the feedforward amplifier 100.

In this way, the signal cancellation circuit 10 detects the distortion component generated by the main amplifier 13 and the distortion eliminating circuit 20 injects the detected distortion component into the output signal of the main amplifier 13, with equal amplitudes, opposite phases, and equal delays. By this operation, the feedforward amplifier 100 compensates for the distortion component generated by the main amplifier 13.

If there is no other active circuit in the rest of the feedforward amplifier 100, power consumption of the feedforward amplifier 100 is determined by the power consumption of the main amplifier 13 and the auxiliary amplifier 23 which are active circuits. The power efficiency of the feedforward amplifier is the ratio between the output power and power consumption of the feedforward amplifier.

A method for increasing the power efficiency of the feedforward amplifier 100 is to reduce the power consumption of the active circuits in the feedforward amplifier 100 while maintaining linearity. However, reduction of power consumptions of the main amplifier 13 and the auxiliary amplifier 23 reduces a current supplied to each amplifying element and therefore increases distortion components generated by the amplifying elements. There is a trade-off between reduction of power consumption and distortion generated.

If the power consumption of the auxiliary amplifier 23 is reduced, the distortion component detected by the signal cancellation circuit 10 is further distorted in the auxiliary amplifier 23 and consequently a distortion component that differs from the distortion component to be eliminated is generated. As a result, the distortion component generated by the main amplifier 13 cannot sufficiently be eliminated. The auxiliary amplifier 23 has to linearly amplify the distortion component detected by the signal cancellation circuit 10. Therefore, usually a Class A amplifier is used as the auxiliary amplifier 23 and its power consumption cannot significantly be reduced.

Main amplifiers to which a high-efficiency amplification technique is applied have been proposed in order to improve main amplifier power efficiency. One of such main amplifiers is a Doherty amplifier (Patent literature 1). The Doherty amplifier includes a carrier amplifier and a peak amplifier (Non-patent literature 2). When the input power of the Doherty amplifier exceeds a certain value, the peak amplifier operates and an output from the peak amplifier is combined with an output from the carrier amplifier. The Doherty amplifier can achieve high power efficiency because the carrier amplifier is operating in saturation in an input power region in which the peak amplifier operates. It has been reported that the power efficiency of a 2-GHz-band feedforward amplifier for W-CDMA can be improved by 2% with the Doherty amplifier used as its main amplifier (Non-patent literature 3).
Patent literature 1: U.S. Pat. No. 6,320,464
Non-patent literature 2: S. C. Cripps, Advanced Techniques in RF Power Amplifier Design, Artech House, 2002.
Non-patent literature 3: K-J. Cho, J-H, Kim, and S. P. Stapleton, "A highly efficient Doherty feedforward linear power amplifier for W-CDMA base-station applications", IEEE Transactions on Microwave Theory and Techniques, Vol. 53, No. 1, January 2005.

The nonlinear characteristic of the Doherty amplifier is generated on different principles in a region in which the peak amplifier operates and a region in which the peak amplifier does not operate. In the region in which the peak amplifier does not operate, the nonlinear characteristic of the Doherty amplifier is that of the carrier amplifier. In the region in which the peak amplifier operates, the nonlinear characteristic of the Doherty amplifier is the combination of that of the carrier amplifier and the peak amplifier. The Doherty amplifier is capable of achieving high power efficiency in the region in which the peak amplifier operates. However, the nonlinear characteristic of the Doherty amplifier is complicated compared with that of the carrier amplifier alone.

A feedforward amplifier that uses the Doherty amplifier as its main amplifier should compensate for the complicated nonlinear characteristic of the Doherty amplifier. If distortion of the feedforward amplifier is ideally compensated for, all distortion components contained in an output signal of the Doherty amplifier are eliminated. However, actual feedforward amplifiers cannot completely eliminate distortion components generated by the main amplifier. This is because adjustments for achieving equal amplitudes, opposite phases, and equal delays in the signal cancellation circuit and the distortion eliminating circuit have limitations and because the frequency characteristics of the signal cancellation circuit and distortion eliminating circuit do not completely compensate for the frequency characteristic of the complicated nonlinearity generated by the Doherty amplifier. Therefore, there is a problem that while a high power efficiency can be achieved in a situation in which the peak amplifier operates, distortion cannot sufficiently be compensated for due to the complicated nonlinear characteristic. If the Doherty amplifier is used as the main amplifier in order that the ACLR may be less than or equal to a specification value specified in a radio communications standard, the power efficiency cannot be improved because an output back-off of 5 dB or so is required.

SUMMARY OF THE INVENTION

An object of the present invention is to provide a feedforward amplifier capable of achieving high power efficiency without generating complicated nonlinear distortion and a method for controlling the feedforward amplifier in such way.

A feedforward amplifier according to the present embodiment includes: a divider distributing an input signal into a main amplifier path and a linear transfer path, the main amplifier path including a main amplifier; a combiner/divider combining an output signal of the main amplifier path and an output signal of the liner transfer path to generate a signal input to a main amplifier output transfer path and a signal input to a distortion injection path including an auxiliary amplifier; and a power combiner combining an output signal of the main amplifier output transfer path and an output signal of the distortion injection path and thereby outputting an output signal; wherein the main amplifier is a harmonic reaction amplifier; the feedforward amplifier further includes: a first directional coupler extracting a part of the output signal of the power combiner; and a controller controlling an operating point of the harmonic reaction amplifier on the basis of the signal extracted by the first directional coupler.

According to the present invention, there is provided a method for controlling feedforward amplifier including: a divider distributing an input signal into a main amplifier path and a linear transfer path, the main amplifier path including a harmonic reaction amplifier as a main amplifier; a combiner/divider combining an output signal of the main amplifier path and an output signal of the linear transfer path to generate a signal input to a main amplifier output transfer path and a signal input to a distortion injection path including an auxiliary amplifier; a power combiner combining an output signal of the main amplifier output transfer path and an output signal of the distortion injection path and thereby outputting an output signal; a first directional coupler extracting a part of the output signal of the power combiner; and a controller controlling an operating point of the harmonic reaction amplifier on the basis of the signal extracted by the first directional coupler; the harmonic reaction amplifier including: a second divider dividing a signal input in the harmonic reaction amplifier into two; a first transistor having a gate to which one of the two signals distributed is provided and amplifying power; a second transistor having a gate to which the other of the two signals distributed is provided and amplifying power; a second-order harmonic termination circuit terminating second harmonics between outputs of the first and second transistors; a second power combiner combining the powers of the two second-harmonic terminated signals to generate an output of the harmonic reaction amplifier; and two gate bias setting circuits setting a gate bias voltage of the first transistor and a gate bias voltage of the second transistor in accordance with control by the controller; the control method including the step of: detecting a main wave component which is the input signal of the feedforward amplifier and an out-of-band distortion component generated by the main amplifier from the output signal of the feedforward amplifier and alternately controlling gate bias voltages of the first and second transistors of the harmonic reaction amplifier to maximize power efficiency of the feedforward amplifier under the condition that an ACLR calculated from the main wave component and the out-of-band distortion component is less than or equal to a predetermined reference value.

EFFECTS OF THE INVENTION

The configuration and the control method of the feedforward amplifier can implement a highly efficient feedforward amplifier without generating complicated nonlinear distortion because an operating point of the harmonic reaction amplifier used as the main amplifier is controlled on the basis of the output of the feedforward amplifier.

BRIEF DESCRIPTION OF THE DRAWINGS

FIG. 3 is a diagram showing an exemplary configuration of a harmonic reaction amplifier used in embodiments of the present invention.

DETAILED DESCRIPTION

First Embodiment

Figure 1:
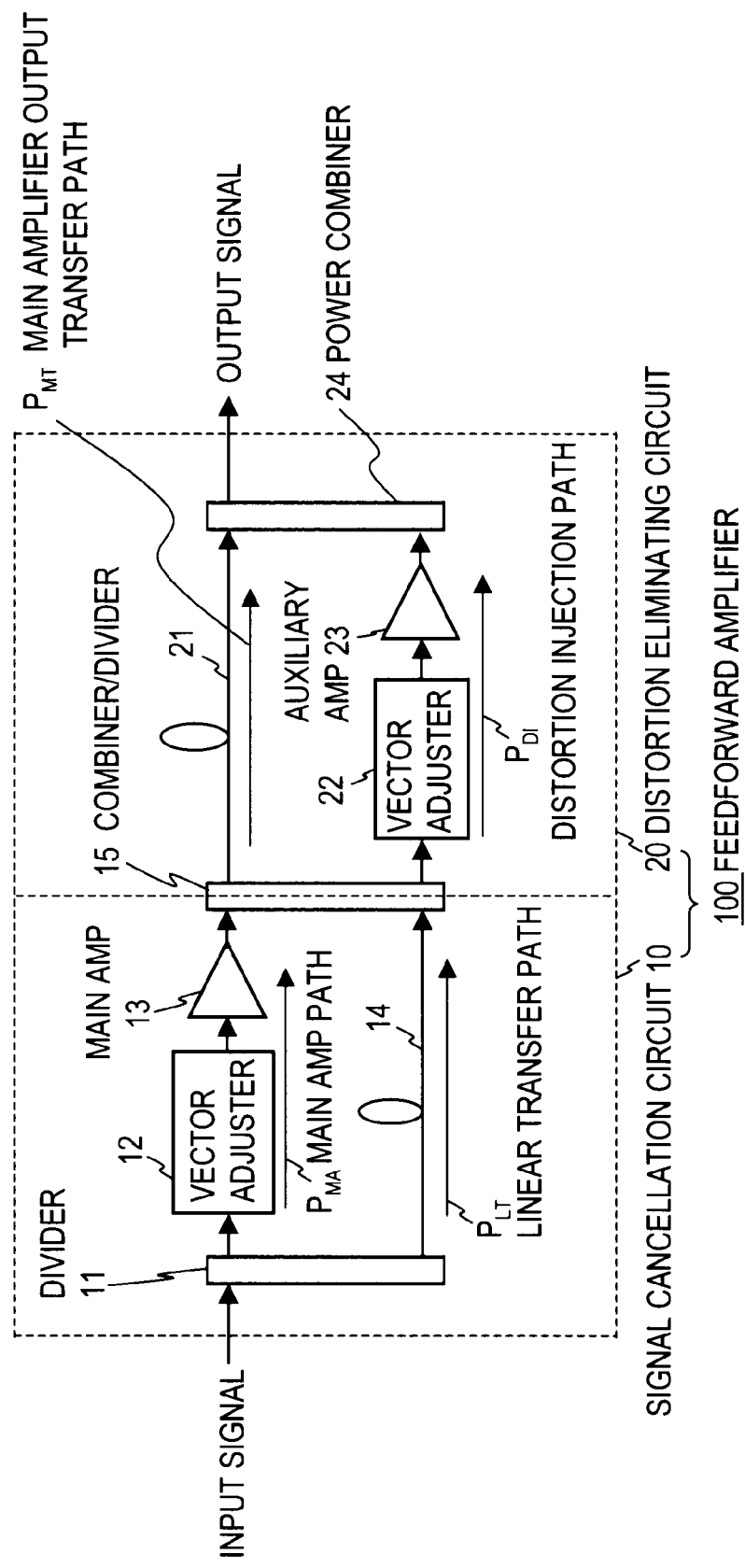
FIG. 1 is a block diagram showing an example of a conventional feedforward amplifier.
Figure 2:
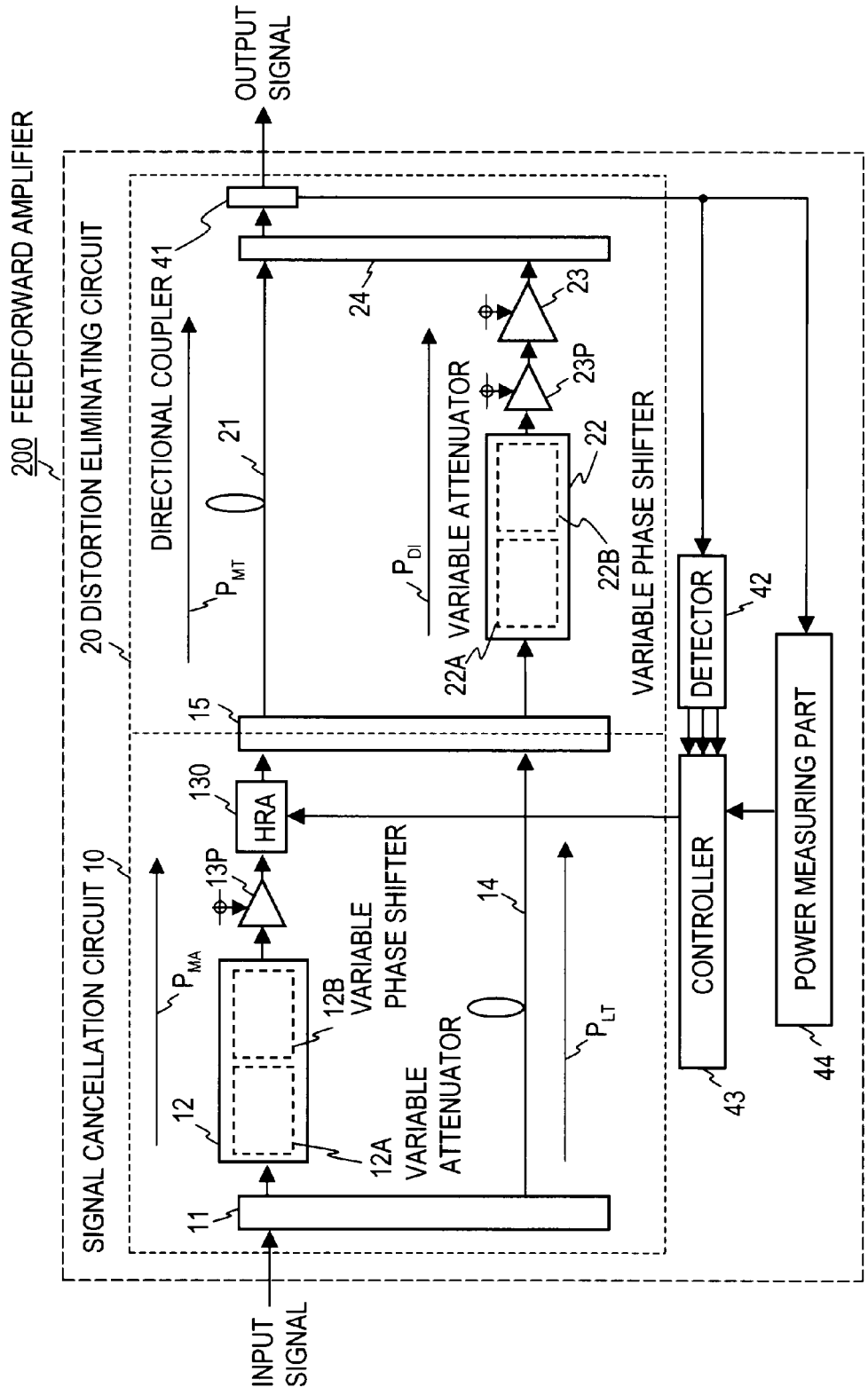
FIG. 2 is a block diagram showing a first embodiment of a feedforward amplifier according to the present invention.

FIG. 2 shows a feedforward amplifier 200 of a first embodiment in the present invention. The components of the feedforward amplifier 200 that correspond to the components of the conventional feedforward amplifier 100 shown in FIG. 1 are labeled with the same reference numerals used in FIG. 1. Features of the feedforward amplifier 200 are that a Harmonic Reaction Amplifier (HRA) 130 is used as its main amplifier and that the operating point of the HRA 130 is controlled so that the maximum power efficiency of the feedforward amplifier 200 is achieved. For the purpose of the control, there are provided a directional coupler 41 which extracts a part of an output from the feedforward amplifier 200, a detector 42 which detects a main wave component and an out-of-band distortion component contained in the extracted signal, a power measuring part 44 which measures the output power of the feedforward amplifier 200 and supply power to the feedforward amplifier 200, and a controller 43 which controls the operating point of the HRA 130 to maximize the power efficiency of the feedforward amplifier 200 on the basis of the output from the detector 42 and the measurements by the power measuring part 44.

Like the conventional feedforward amplifier shown in FIG. 1, the feedforward amplifier 200 includes a divider 11 which evenly distributes an input signal into a main amplifier path $P_{MA}$ and a linear transfer path $P_{LT}$, a combiner/divider 15 which combines an output signal of the main amplifier path $P_{MA}$ and an output signal of the linear transfer path $P_{LT}$ and outputs a main wave component and a distortion component that was generated by the main amplifier 130 to a main amplifier output transfer path $P_{MT}$ and the distortion component to the distortion injection path $P_{DI}$, and a power combiner 24 that combines an output signal of the main amplifier output transfer path $P_{MT}$ and an output signal of the distortion injection path $P_{DI}$. A vector adjuster 12 including a variable attenuator 12A and a variable phase shifter 12B, a preamplifier 13P, and the HRA 130 are provided in the main amplifier path $P_{MA}$. The linear transfer path $P_{LT}$ and the main amplifier output transfer path $P_{MT}$ are delay lines 14 and 21, respectively. A vector adjuster 22 including a variable attenuator 22A and a variable phase shifter 22B, a preamplifier 23P, and an auxiliary amplifier 23 are provided in the distortion injection path $P_{DI}$.

As shown in FIG. 3, the HRA 130 as the main amplifier includes a divider 31 which evenly divides and distributes a signal input in the HRA 130 into two paths, two input matching circuits 32A and 32B, two gate bias setting circuits 37A and 37B, two transistors (for example, microwave transistors in this embodiment) 33A and 33B, two output matching circuits 34A and 34B, two drain bias setting circuits 38A and 38B, a second-order harmonic termination circuit 35 which terminates second harmonics between the outputs of the two output matching circuits 34A and 34B, and a power combiner 36 which combines signals output from the two output matching circuits 34A and 34B.

The input matching circuits 32A and 32B and the output matching circuits 34A and 34B are configured in such a manner that each of the matching circuits uses a microstrip line to perform impedance matching at a design frequency. The gate bias setting circuits 37A and 37B have control terminals $T_{GCA}$ and $T_{GCB}$, respectively, to which a control signal is provided from the controller 43, and provide specified gate bias voltages $V_{GB1}$ and $V_{GB2}$ to the gates of transistors 33A and 33B, respectively, in accordance with the control signal from the controller 43. The drain bias setting circuits 38A and 38B also have control terminals $T_{DCA}$ and $T_{DCB}$ to which the control signal is provided from the controller 43, and provide specified drain bias voltages to the drains of the transistors 33A and 33B in accordance with the control signal from the controller 43. The configuration of the HRA, excluding the gate bias setting circuits 37A and 37B and the drain bias setting circuits 38A and 38B, is described in Japanese Patent Application Laid-Open No. 63-153904, for example.

The provision of the second-order harmonic termination circuit 35 that terminates second harmonic waves of signals output from the output matching circuits 34A and 34B allows the HRA 130 to function as a parallel amplifier with Class F operation (Conditions for Class F operation are that even harmonics are terminated and odd harmonics are open and, in the first embodiment, second harmonic termination is implemented) or Class J operation. In general, higher power efficiencies can be achieved by increasing the order of termination and open in the Class F operation conditions. However, second harmonic termination suffices in view of the ease of circuit configuration and the degree of efficiency improvement. In addition, amplification of high-order harmonics with a sufficient gain has limitations due to the frequency characteristics of the transistors 33A and 33B. For these practical reasons, the HRA 130 in the first embodiment includes a circuit that terminates second harmonics.

The HRA 130 combines the main wave components in the same phase and combines the distortion components without taking into consideration their phases and amplitudes. This operation can compensate for the distortion components by 3 dB with respect to the main wave components. In addition, the HRA 130 achieves a maximum drain efficiency of greater than 80%. Since the HRA 130 has such high maximum drain efficiency and is capable of compensating for distortion components, the HRA 130 is suitable as the main amplifier of the feedforward amplifier.

Unlike the bias setting conditions of the carrier amplifier and the peak amplifier of the Doherty amplifier, approximately equal bias voltages are set for the two transistors 33A and 33B in the HRA 130. Accordingly, the two transistors 33A and 33B have nearly identical operating points and do not generate complicated nonlinear characteristics that would be clearly generated when the peak amplifier of the Doherty amplifier operates. The HRA 130 improves the power efficiency of the feedforward amplifier 200 while easing the nonlinear characteristic of the feedforward amplifier 200.

The gate bias voltages in the HRA 130 are set so that power efficiency is increased and out-of-band distortion components are reduced. In push-pull amplifiers and balanced amplifiers in general, the two gate bias voltages are set to the same voltage. The HRA 130 has two amplifies in parallel with each other. The characteristics of the amplifiers are not exactly identical because of differences between individual transistors and differences in adjustment of the individual amplifies. By fine adjustment of the gate bias voltages, out-of-band distortion components and power efficiency of the HRA 130 can be set optimally from the viewpoint of the feedforward amplifier 200. However, out-of-band distortion components and power efficiency of the HRA 130 itself cannot always be set optimally. Therefore, by monitoring out-of-bound distortion components of an output of the feedforward amplifier 200 and the power consumption of the feedforward amplifier 200, the gate bias voltages are controlled so as to increase the power efficiency while maintaining out-of-band distortion components at a level specified in standards.

Operation of the HRA 130 can be further adjusted by controlling the drain bias voltages. In general, by controlling drain bias voltages, efficient amplification can be achieved while maintaining linearity. By combining gate bias voltage control and drain bias voltage control, the power efficiency and linearity of the HRA 130 can be improved while maintaining advantages of both.

Figure 4C:
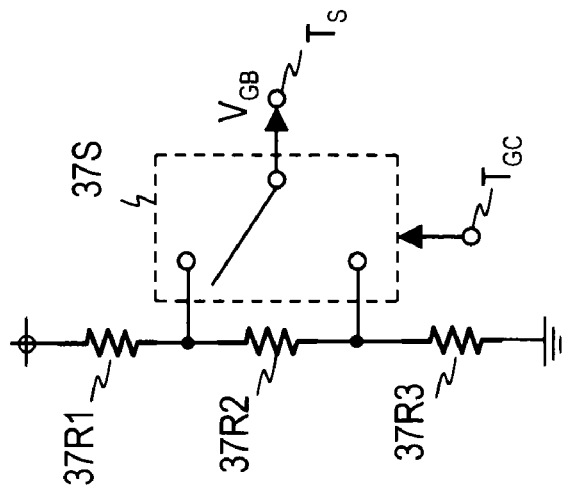
FIG. 4C is a diagram showing an exemplary configuration of a gate bias setting circuit using resistors for a voltage divide.
Figure 4B:
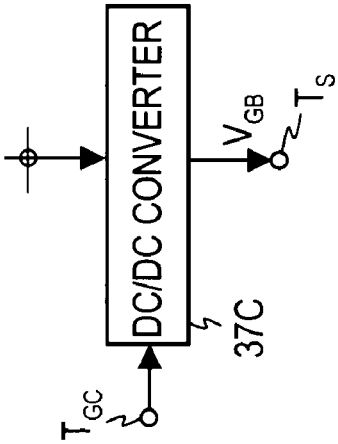
FIG. 4B is a diagram showing an exemplary configuration of a gate bias setting circuit using a DC-DC converter.
Figure 4A:
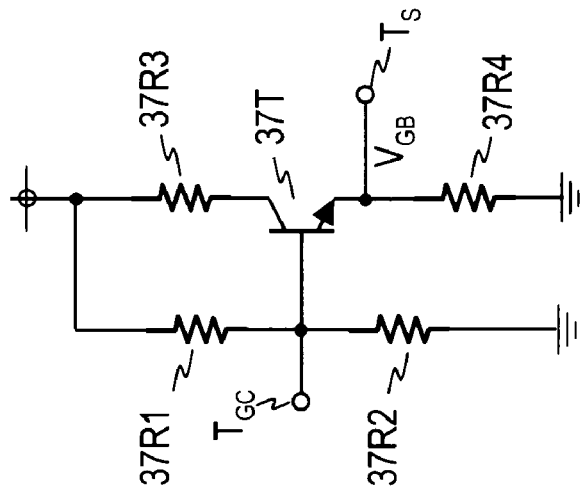
FIG. 4A is a diagram showing an exemplary configuration of a gate bias setting circuit using a current feedback transistor circuit.

The gate bias setting circuits 37A and 37B have the same configuration. Exemplary configurations are shown in FIGS. 4A, 4B, and 4C. FIG. 4A shows an example in which a well-known current feedback circuit including a transistor 37T and resistors 37R1 to 37R4 is used as the gate bias setting circuit 37A, 37B. A control voltage is provided from the controller 43 to a gate bias control terminal $T_{GC}$ ($T_{GCA}$, $T_{GCB}$) and a source voltage which is determined in response to the control voltage is provided from a terminal $T_S$ to the gate of the transistor 33A, 33B as a gate bias voltage $V_{GB}$ ($V_{GB1}$, $V_{GB2}$). FIG. 4B shows an example in which a DC-DC converter 37C is used as the gate bias setting circuit 37A, 37B. A control voltage provided from the controller 43 to the terminal $T_{GC}$ ($T_{GCA}$, $T_{GCB}$) is converted by the DC-DC converter 37C to a corresponding gate bias voltage $V_{GB}$ ($V_{GB1}$, $V_{GB2}$) and the gate bias voltage $V_{GB}$ is output from the terminal $T_S$. In the configuration shown in FIG. 4C, one of voltages into which a voltage is divided by multiple resistances 37R1, 37R2, 37R3 connected in series is selected by a switch 37S in accordance with a control voltage provided to the gate bias control terminal $T_{GC}$ ($T_{GCA}$, $T_{GCB}$) and is output from the terminal $T_S$ as the gate bias voltage $V_{GB}$ ($V_{GB1}$, $V_{GB2}$). In this way, the gate bias setting circuits 37A and 37B control only voltage and therefore can be configured simply as shown in FIGS. 4A to 4C. In the examples in FIGS. 4A and 4B, the gate bias voltage $V_{GB}$ can be continuously controlled using the control voltage from the controller 43. In the example in FIG. 4C, the gate bias voltage $V_{GB}$ can be discretely controlled by using the control voltage from the controller 43.

The drain bias setting circuits 38A and 38B can use the same configuration as that of the gate bias setting circuits 37A, 37B. In this case, the term "gate bias" used in the description of the gate bias setting circuits 37A and 37B can be simply replaced with the term "drain bias".

Referring back to FIG. 2, the output signal of the power combiner 24 is output through the directional coupler 41 as an output of the feedforward amplifier. A part of the power is branched by the directional coupler 41 to the detector 42. The detector 42 detects a main wave component and an out-of-band distortion component.

Figure 5:
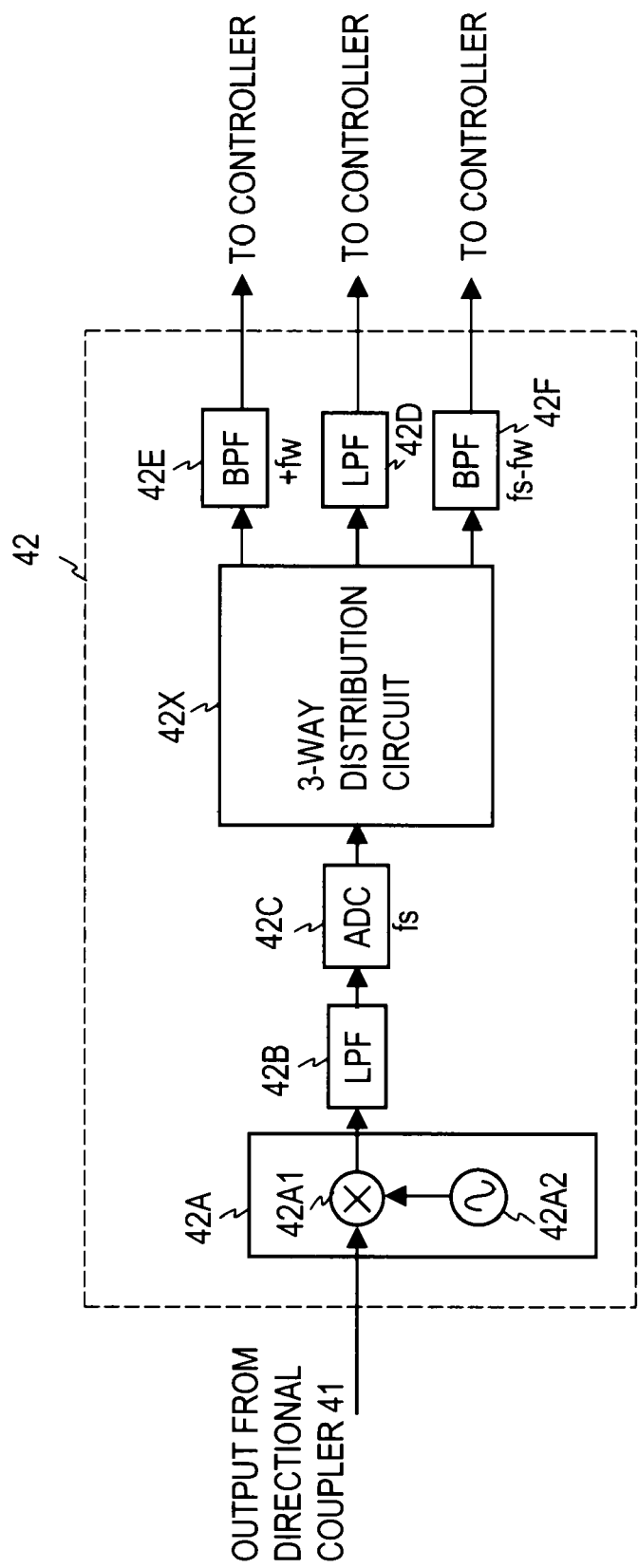
FIG. 5 is a block diagram showing an exemplary configuration of a detector.

FIG. 5 shows an exemplary configuration of the detector 42. A signal extracted by the directional coupler 41 is converted by a frequency converter 42A to a baseband signal. The frequency converter 42A includes a mixer 42A1 and a local oscillator 42A2, for example. A low-pass filter 42B removes aliasing from the baseband signal. An analog-digital converter 42C digitizes the output signal of the low-pass filter 42B at a sampling frequency fs. A 3-way distribution circuit 42X divides the digital signal into three. A main wave component from the 3-way distribution circuit 42X is extracted by a digital low-pass filter 42D. Upper and lower band distortion components $AC_U$ and $AC_L$ from the 3-way distribution circuit 42X are extracted by digital band-pass filters 42E and 42F, respectively. The passband widths $BP_U$ and $BP_L$ of the digital band-pass filters 42E and 42F are determined by taking into consideration the out-of-band attenuation characteristics of the filters so that out-of-band distortion components centered on fw and fs−fw (where fw is a frequency equivalent to the bandwidth of the main wave component $W_T$), respectively, can be adequately detected.

Figure 6A:
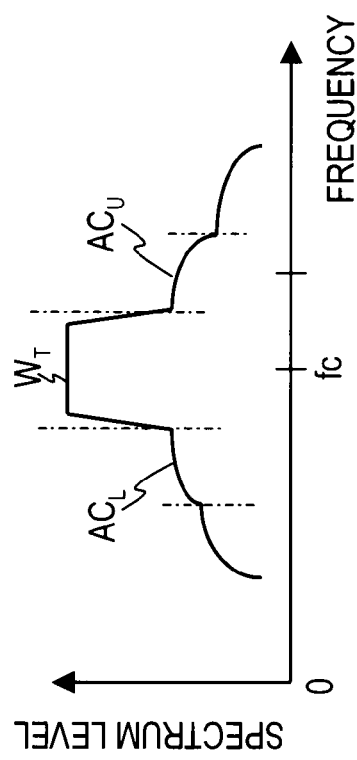
FIG. 6A is a graph showing an exemplary output spectrum of the feedforward amplifier.
Figure 6B:
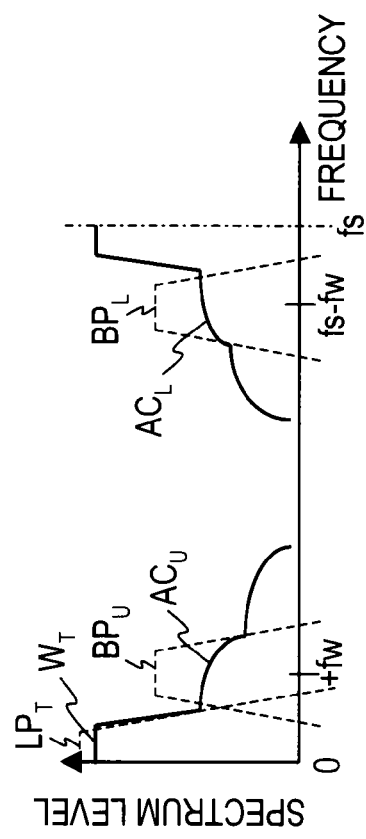
FIG. 6B is a graph showing an exemplary spectrum converted into a baseband.

FIG. 6A shows an exemplary spectrum of an input signal of the frequency converter 42A shown in FIG. 5A. FIG. 6B shows an exemplary spectrum of an output from the A-D converter 42C. As shown in FIG. 6A, the upper and lower out-of-band distortion components $AC_U$ and $AC_L$ lie adjacent to the upper and lower sides of the main wave component $W_T$ with a carrier frequency fc as a center frequency. The upper and lower out-of-band distortion components $AC_U$ and $AC_L$ need to be detected without being suppressed by the main wave component $W_T$. However, it is difficult to implement a filter that has such a steep frequency characteristic that allows upper and lower out-of-band distortion components $AC_U$ and $AC_L$ shown in FIG. 6A in a microwave-band to be extracted separately from the main wave component $W_T$. Therefore, the frequency converter 42A is used to convert the microwave-band signal extracted by the directional coupler 41 to a baseband in the example shown in FIG. 5.

FIG. 6B shows an exemplary spectrum of a digitized baseband signal. The exemplary spectrum can be obtained by, first, converting an output signal of the low-pass filter 42B to a digital baseband signal by the analog-digital converter 42C at a sampling frequency fs and, next, Fourier-transforming the digital baseband signal. The upper and lower out-of-band distortion components $AC_U$ and $AC_L$ to be extracted are extracted by the digital band-pass filters 42E and 42F having passbands $BP_U$ and $BP_L$, respectively. The main wave component $W_T$ is extracted by the digital low-pass filter 42D having a passband $LP_T$. Outputs from the digital filters 42D, 42E, and 42F are provided to the controller 43, where the power of each of the components detected is calculated. The digital filters 42D, 42E, and 42F can be implemented by FIR filters, for example. Instead of using the digital filters 42D, 42E, and 42F, the output signal of the analog-digital converter 42C may be Fourier-transformed to extract frequency components corresponding to the upper and lower distortion and main wave components.

Figure 7:
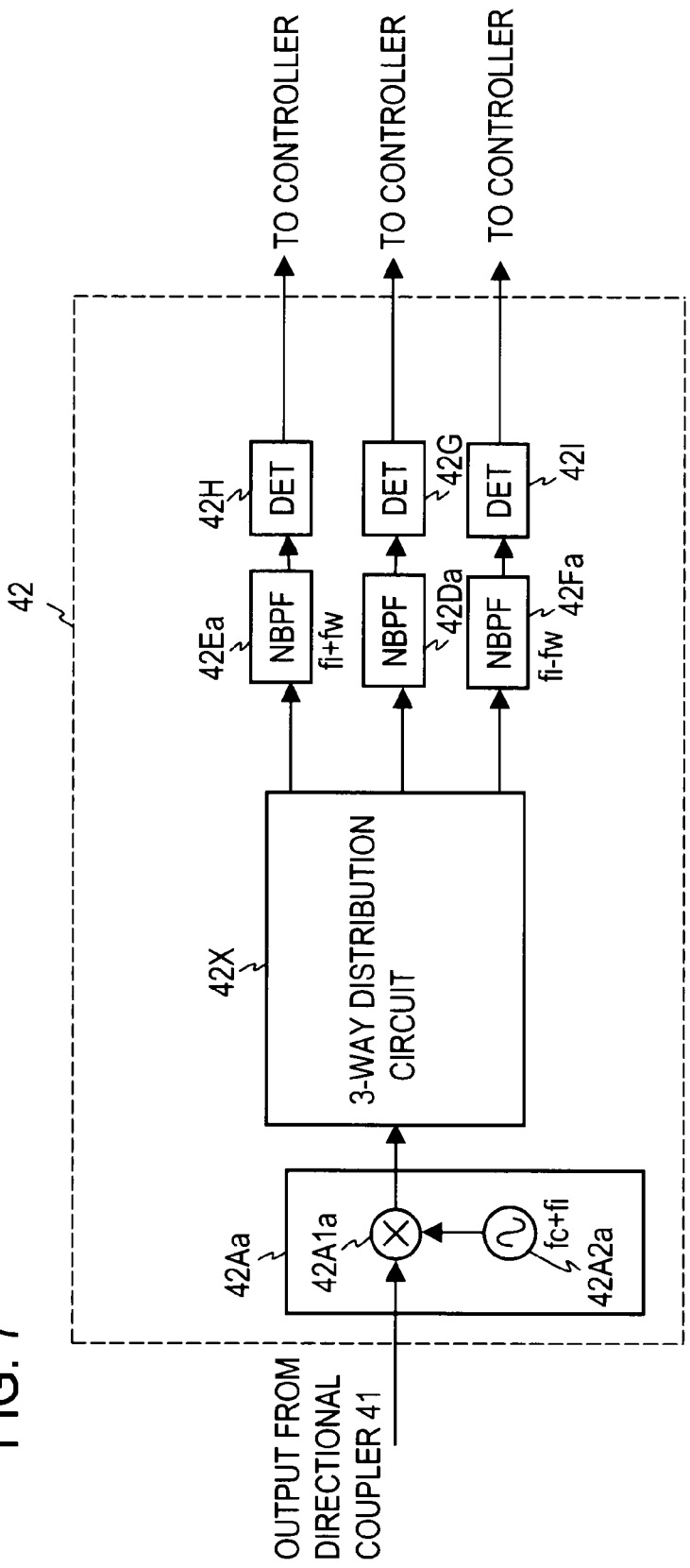
FIG. 7 is a block diagram showing another exemplary configuration of the detector.

FIG. 7 shows another exemplary configuration of the detector 42. The detector 42 in the example includes an IF frequency converter 42A$a$ including a mixer 42A1$a$ and a local oscillator 42A2$a$, narrowband-pass filters 42D$a$, 42E$a$, and 42F$a$, and power detectors 42Q 42H, and 42I. The IF converter 42A$a$ converts a microwave-band signal extracted by the directional coupler 41 to an IF band (for example 15 MHz) with a center frequency fi. The 3-way distribution circuit 42X divides the converted IF-band signal into three. The signals output from the 3-way distribution circuit 42X are input in the narrowband-pass filters 42D$a$, 42E$a$, and 42F$a$, respectively, having frequency characteristics that enable detection of the main wave component $W_T$ and upper and lower out-of-band distortion components $AC_U$ and $AC_L$. For example, the narrowband-pass filter 42E$a$ extracts an upper out-of-band distortion component centered on a frequency of fi+fw and the narrowband-pass filter 42F$a$ extracts a lower out-of-band distortion component centered on a frequency fi−fw, where fw is the frequency equivalent to the bandwidth of a main wave component $W_T$. The narrowband-pass filter 42D$a$ extracts a main wave component centered on frequency fi. The narrowband-pass filters 42D$a$, 42E$a$, and 42F$a$ can be implemented by SAW filters or ceramic filters. Outputs from the narrowband-pass filters 42D$a$, 42E$a$, and 42F$a$ are provided to the power detectors 42Q 42H, and 42I. The power detectors 42Q 42H, and 42I measure the power of the main wave component and upper and lower out-of-band distortion components, respectively. The power detectors 42G, 42H, and 42I may be implemented by ICs such as log amplifiers.

The power consumption of the entire feedforward amplifier (including the controller 43, preamplifiers 13P and 23P, HRA 130, auxiliary amplifier 23, and other components) can be obtained by the power measuring part 44 measuring currents supplied to the circuits of the feedforward amplifier. For example, in the case of alternate-current supply, the power measuring part 44 can use a clamp meter to measure the current. In the case of direct-current supply, the power measuring part 44 can use a shunt resistance (of the order of 1 milliohm) provided at the feeding point for each circuit to measure the value of current. The power measuring part 44 multiplies the measured current values by a known voltage value to obtain the supply power, that is, power consumption, of the entire feedforward amplifier. The power measuring part 44 also measures the output power of the feedforward amplifier. The results of measurements by the power measuring part 44 are sent to the controller 43.

The controller 43 performs predetermined control based on the power of the main wave component and the powers of the upper and lower out-of-band distortion components detected by the detector 42 and the output power and power consumption of the entire feedforward amplifier measured by the power measuring part 44. That is, the controller 43 controls the gate bias voltages in the HRA 130 so as to maximize the power efficiency of the feedforward amplifier while maintaining the ratio between the power of each of the upper and lower out-of-band distortion components and the power of the main wave component, that is, ACLR, at a predetermined value or below. The controller can be implemented by a microprocessor, for example.

Figure 8B:
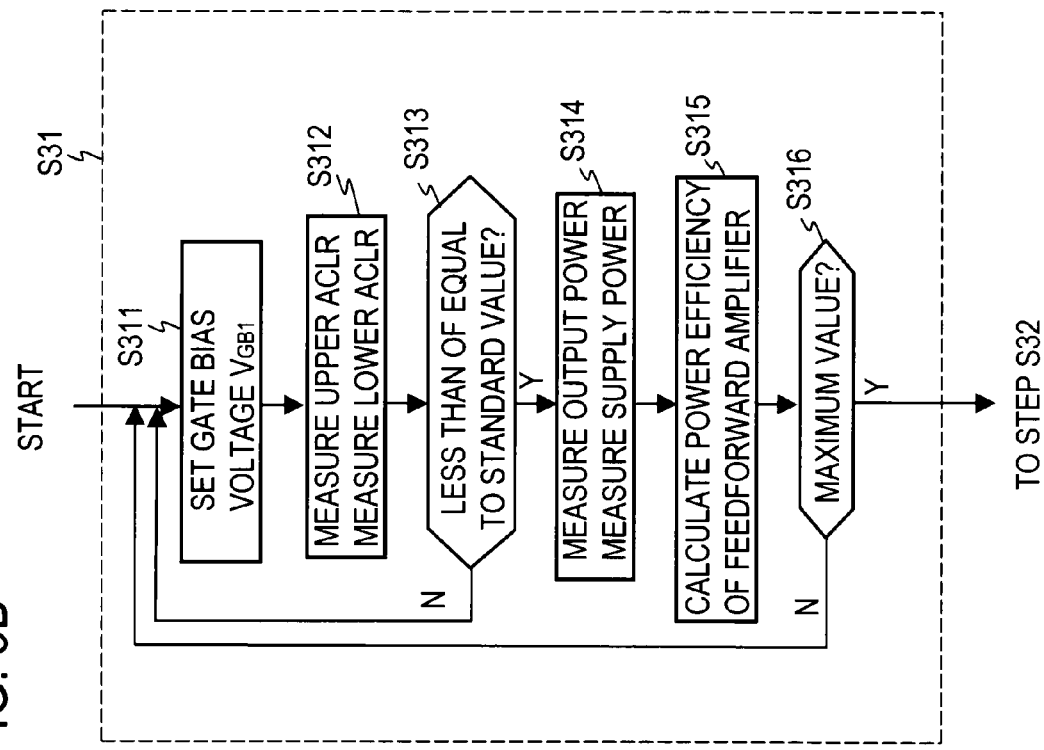
FIG. 8B is a flowchart showing details of a procedure for searching for a gate bias voltage set value.
Figure 8A:
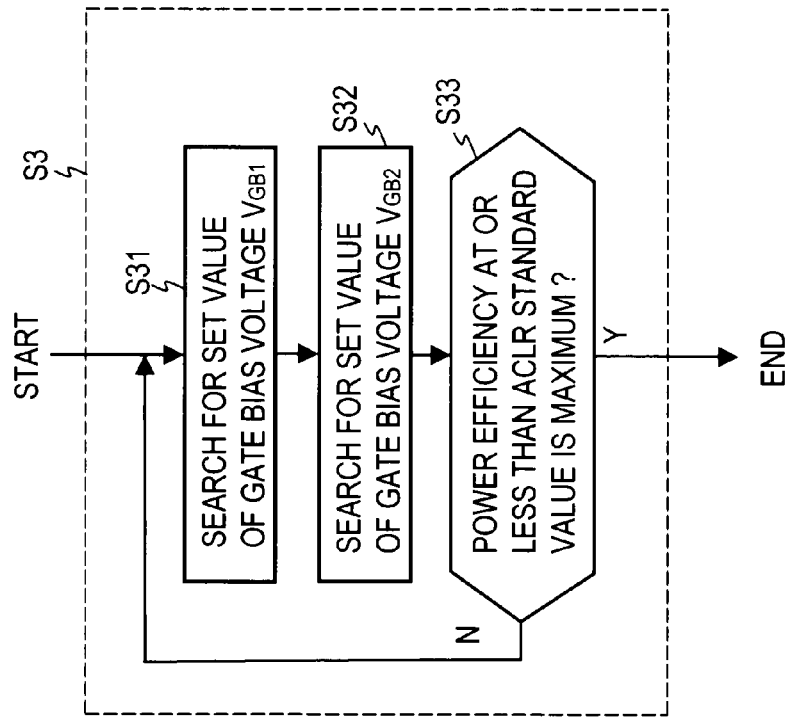
FIG. 8A is a flowchart showing an outline of an exemplary procedure for setting a gate bias voltage.

FIG. 8A shows a flowchart outlining HRA 130 gate bias voltage control performed by the controller 43 after completion of loop adjustments of the signal cancellation circuit 10 and the distortion eliminating circuit 20. In the first embodiment, loop adjustment of the signal cancellation circuit 10 (step S1) and loop adjustment of the distortion eliminating circuit 20 (step S2) are performed. Each of the vector adjusters 12 and 22 performs the loop adjustment until the power of the out-of-band distortion component detected by the detector 42 becomes (1) a minimum value, or (2) less than or equal to a standard value specified by a standards, or (3) less than or equal to a design value determined by taking into consideration factors such as an operating margin, while the gate and drain bias voltages of the HRA 130 are set at standard values. The method for the adjustment is the same as a conventional technique and therefore the description thereof will be omitted. The controller 43 changes a control voltage being provided to the control terminal $T_{GCA}$ of the gate bias setting circuit 37A (thereby changing the gate bias voltage $V_{GB1}$ at the transistor 33A) in the HRA 130 to determine a gate bias voltage $V_{GB1}$ that maximizes the power efficiency of the feedforward amplifier 200 under the condition that the ACLR of an output from the feedforward amplifier 200 is less than or equal to a standard value (step S31). Then, the controller 43 changes a control voltage being provided to the control terminal $T_{GCB}$ of the gate bias setting circuit 37B (thereby changing the gate bias voltage $V_{CB2}$ at the transistor 33B) to determine a gate bias voltage $V_{BG2}$ that maximizes the power efficiency of the feedforward amplifier 200 under the condition that the ACLR of the output from the feedforward amplifier 200 is less than or equal to the standard value (step S32). Since the condition obtained at step S31 is not necessarily kept under the influence of the bias control at step S32, control is performed to cause steps S31 and S32 to be repeated until the power efficiency of the feedforward amplifier 200 is maximized under the condition that the ACLR is less than or equal to the standard value (step S33).

FIG. 8B shows details of an exemplary control procedure at step S31 shown in FIG. 8A. First, a gate bias voltage $V_{GB1}$ for the transistor 33A is set at step S311. At step S312, the detector 42 measures the power of the main wave component and the powers of the upper and lower out-of-band distortion components of output from the feedforward amplifier 200 and calculates the ratio (ACLR) between the power of each of the upper and lower out-of-band distortion components and the power of the main wave component. At step S313, the controller 43 determines whether both of the ACLRs are less than or equal to the standard value. If at least one of the ACLRs exceeds the standard value, the process returns to step S311, where the set gate bias voltage is changed and steps S311 and S312 are repeated. In doing this, the gate bias voltage $V_{GB2}$ is held constant.

When the ACLRs decrease to the standard value or below, the power measuring part 44 measures the output power and supply power of the feedforward amplifier 200 at step S314. At step S315, the controller 43 calculates the power efficiency of the feedforward amplifier 200 on the basis of the output power and the supply power of the feedforward amplifier 200. At step S316, the controller 43 determines whether the power efficiency is less than the previously calculated power efficiency. If the newly obtained power efficiency is less than the previous power efficiencies, the controller 43 returns to step S311 and re-sets the gate bias voltage $V_{GB1}$. Establishment of the maximum value at step S316 is performed as follows by using the power efficiency of the feedforward amplifier 200 calculated at step S315. If the output power of the feedforward amplifier 200 is not under transmission power control, the highest value in a time period of the order of one hour is set; if the output power is under transmission power control, the highest value in a time period until the transmission power is changed is set. In this way, steps S311 to S316 are repeated until the power efficiency of the feedforward amplifier 200 becomes maximum, thereby controlling the gate bias voltage $V_{GB1}$.

The steepest descent method or LMS (least-mean-square) algorithm can be used as an algorithm for controlling the gate bias voltage $V_{GB1}$ under the condition that voltage variation is constant. Alternatively, control of changing the voltage variation as needed may be allowed. After the power efficiency of the feedforward amplifier 200 is maximized by controlling the gate bias voltage $V_{GB1}$, the gate bias voltage $V_{GB2}$ is controlled at step S32 shown in FIG. 8A while maintaining the gate bias voltage $V_{GB1}$. The control of the gate bias voltage $V_{GB2}$ is performed in the same way the gate bias voltage $V_{GB1}$ is controlled as shown in FIG. 8B. Control of gate bias voltages $V_{GB1}$ and $V_{GB2}$ at steps S31 and S32 are repeated until it is determined at step S33 of FIG. 8A that the power efficacy of the feedforward amplifier 200 is the highest in the time period described above.

Drain bias voltage control is performed by following the same procedure shown in FIGS. 8A and 8B. The term "gate bias voltage" in the control procedure shown in FIGS. 8A and 8B can be simply replaced with the term "drain bias voltage". By changing control voltages being provided to the control terminals $T_{DCA}$ and $T_{DCB}$ of the drain bias setting circuits 38A and 38B, the drain bias voltages that maximize the power efficiency of the feedforward amplifier 200 are searched for and set by following the same procedure shown in the flowchart of the gate bias voltage control described above. The gate bias voltage control and the drain bias voltage control may be alternately repeated. Alternatively, only one of the gate bias voltage and the drain bias voltage may be controlled. If the output power of the feedforward amplifier 200 is changed after completion of the setting of the gate and drain bias voltages, loop adjustments of the vector adjusters 12 and 22 are performed while maintaining the set bias voltages. After the completion of the setting of the vector adjusters 12 and 22, the controller 43 re-sets the gate and drain bias voltages.

Second Embodiment

Figure 9:
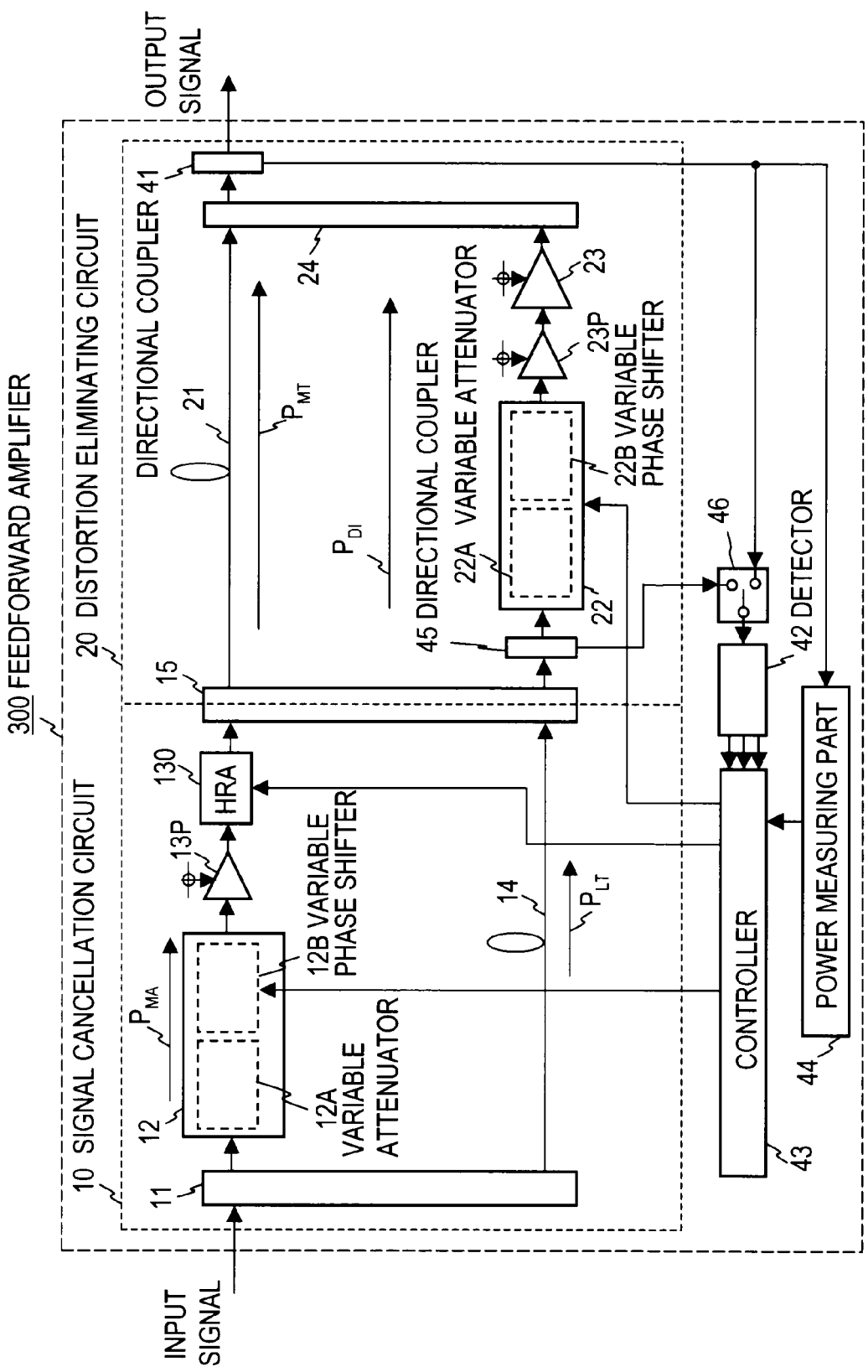
FIG. 9 is a block diagram showing a second embodiment of a feedforward amplifier according to the present invention.

An embodiment for further improving the power efficiency of a feedforward amplifier after the completion of the control of gate and drain bias voltages of an HRA 130 according to the first embodiment will be described. FIG. 9 shows a feedforward amplifier 300 of a second embodiment in the invention. Unlike the feedforward amplifier 200 described above, the feedforward amplifier 300 has a directional coupler 45 provided on the input side of a vector adjuster 22 in a distortion injection path $P_{DI}$ for the purpose of making adjustments for the vector adjusters 12 and 22 of a signal cancellation circuit 10 and a distortion eliminating circuit 20. A switch 46 selects one of signals from the directional couplers 41 and 45 to provide the signal to a detector 42.

Figure 10:
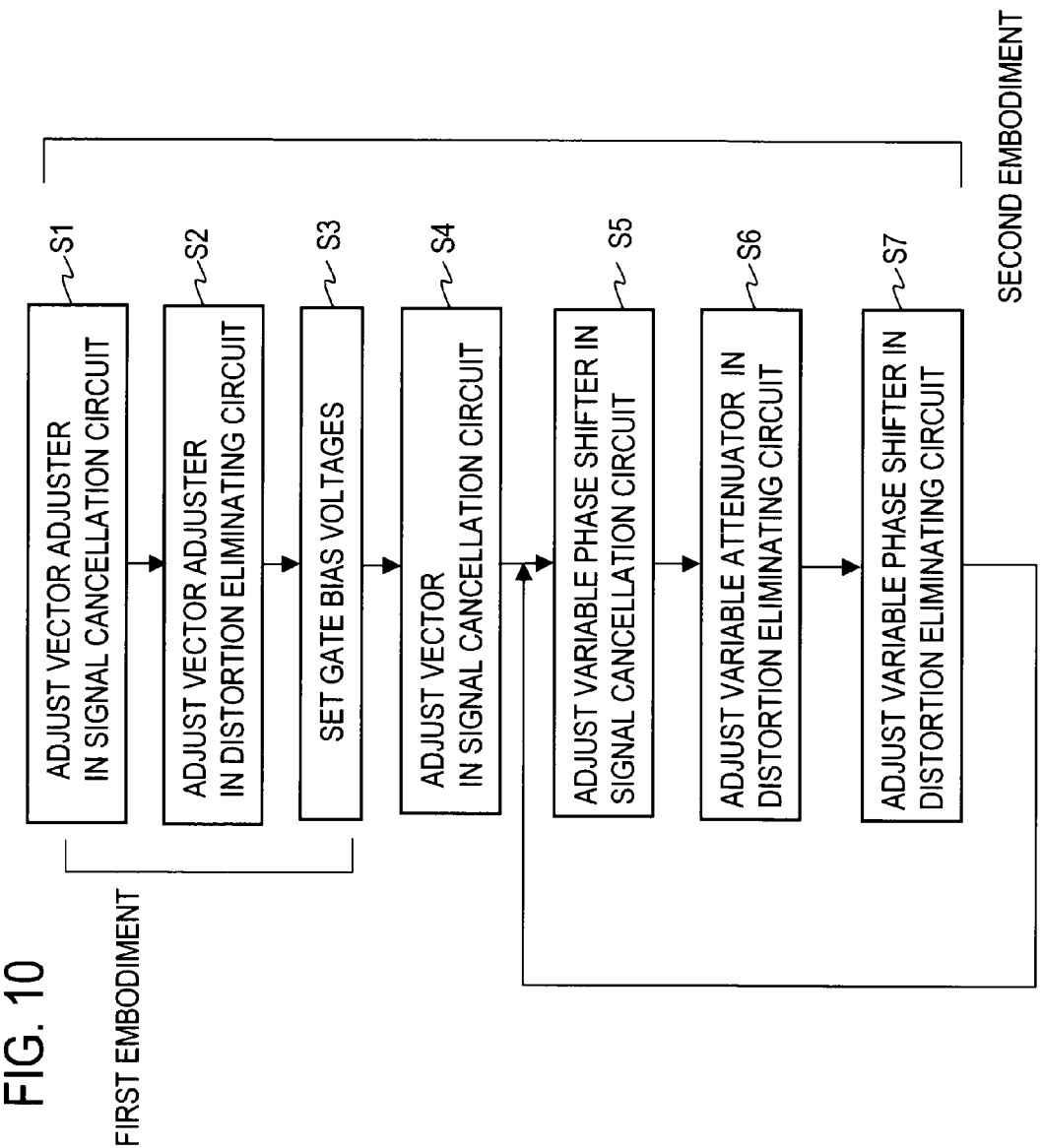
FIG. 10 is a flowchart showing an example of control of the feedforward amplifier in the second embodiment.

A controller 43 controls a variable attenuator 12A and a variable phase shifter 12B of the signal cancellation circuit 10 and a variable attenuator 22A and a variable phase shifter 22B of the distortion eliminating circuit 20. In the second embodiment, the controller 43 further controls adaptively the variable attenuators and phase shifters of the signal cancellation circuit 10 and the distortion eliminating circuit 20 after completion of the same gate bias voltage control as that of the first embodiment. The adaptive control will be described with reference to the flowchart of FIG. 10.

Vector adjustment of the signal cancellation circuit 10 (step S1), vector adjustment of the distortion eliminating circuit 20 (step S2), and gate bias voltage setting control (step S3) are performed first in the same way as that in the first embodiment. In the second embodiment, at step S4 that follows step S3, the detector 42 detects a main wave component in an output from the signal cancellation circuit 10 and an out-of-band distortion component generated by the HRA 130 from a signal extracted by the directional coupler 45 selected by the switch 46. The controller 43 controls the variable attenuator 12A and variable phase shifter 12B of the vector adjuster 12 in the signal cancellation circuit 10 to make the main wave component uniform and minimum. The reason why the main wave component is to be made uniform is that the out-of-band distortion components are suppressed in the distortion eliminating circuit 20 and the main wave components are summed. If the suppression of the main wave components has a frequency characteristic, that is, if the main wave components are not uniformly suppressed, the power combiner 24 cannot uniformly add the main wave components.

At step S5, the detector 42 detects an out-of-band distortion component from a signal extracted by the directional coupler 41 in accordance with selection of the switch 46. Then, the controller 43 controls the variable phase shifter 12B of the signal cancellation circuit 10 so as to reduce the power of the out-of-band distortion component to a minimum. At step S6, the detector 42 further detects an out-of-band distortion component from the signal extracted by the directional coupler 41 in accordance with the selection of the switch 46. The controller 43 controls the variable attenuator 22A of the distortion eliminating circuit 20 so as to reduce the power of the out-of-band distortion component to a minimum. At step S7, the detector 42 detects an out-of-band distortion component in the signal extracted by the directional coupler 41 in accordance with the selection of the switch 46. The controller 43 controls the variable phase shifter 22B of the distortion eliminating circuit 20 so as to reduce the power of the out-of-band distortion component to a minimum.

The controls at steps S5, S6, and S7 adjust the variable attenuator 22A and variable phase shifter 22B of the distortion eliminating circuit 20 so that a phase of the out-of-band distortion component in the distortion injection path $P_{DI}$ in the distortion eliminating circuit 20 is opposite to that of the out-of-band distortion component in the main amplifier output transfer path $P_{MT}$. The controls also adjust the variable phase shifter 12B of the signal cancellation circuit 10 and the variable attenuator 22A and variable phase shifter 22B of the distortion eliminating circuit 20 so that a phase of the main wave component in the distortion injection path $P_{DI}$ is the same as that of the main wave component in the main amplifier output transfer path $P_{MT}$. As a result, the out-of-band distortion components are suppressed while the main wave components are increased.

By controlling the variable attenuators and variable phase shifters of the signal cancellation circuit 10 and the distortion eliminating circuit 20 as described above, the power efficiency of the feedforward amplifier 300 can be maximized while keeping the ACLRs below the standard value. The controller 43 repeats the adjustment of the variable phase shifter 12B of the signal cancellation circuit 10 (step S5), the adjustment of the variable attenuator 22A of the distortion eliminating circuit 20 (step S6), and the adjustment of the variable phase shifter 22B (step S7) in this order a predetermined number of times. By this iterative adjustment, the output power of the feedforward amplifier 300 can be increased while compensating for distortions. Furthermore, the power efficiency of the feedforward amplifier 300 can be increased because the powers of the main wave components are summed by the power combiner 24. The variable attenuator 12A of the signal cancellation circuit 10 is not iteratively controlled because the iterative control would vary the gain of the feedforward amplifier 300.

The series of controls adapts to temperature changes and deterioration of the feedforward amplifier 300 over time. When the HRA, which is the main amplifier, operates in a low back-off region, the series of controls can maximize the power efficiency of the feedforward amplifier while maintaining the power of out-of-band distortions at a constant value or below.

Third Embodiment

Figure 11:
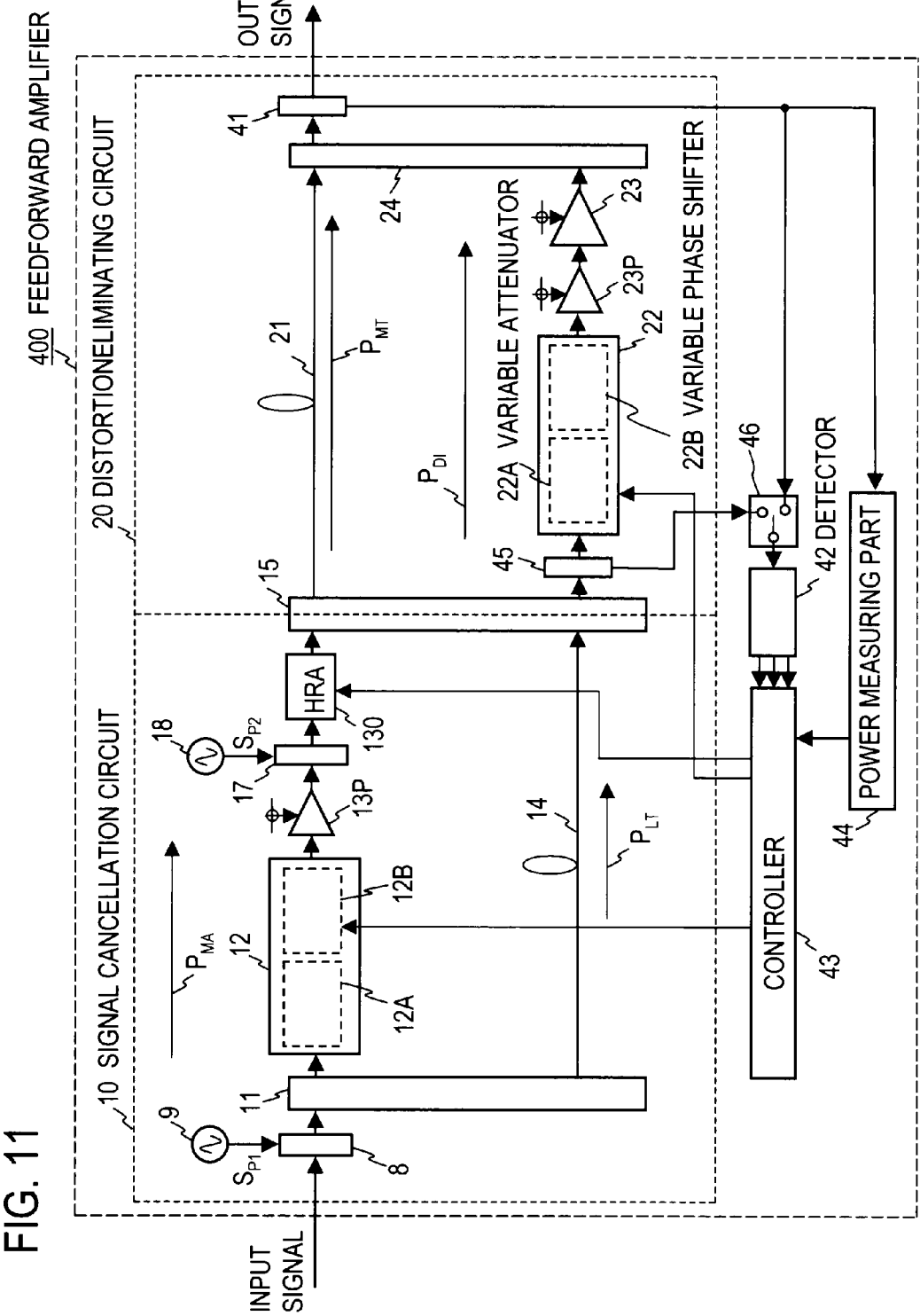
FIG. 11 is a block diagram showing a third embodiment of the present invention.

In a forward amplifier 400 shown in FIG. 11, pilot signals are used to perform control of adjustments of vector adjusters 12 and 22 of a signal cancellation circuit 10 and a distortion eliminating circuit 20 which are the same as those in the feedforward amplifier 300 shown in FIG. 9. The feedforward amplifier 400 further includes a directional coupler 8 provided on the input side of a divider 11, a directional coupler 17 provided between a preamplifier 13P and an HRA 130, a first pilot signal generator 9, and a second pilot signal generator 18, in addition to the components of the feedforward amplifier 300. The first pilot signal generator 9 generates a first pilot signal $S_{P1}$ which is a set of two CW waves with a frequency spacing of approximately 1 kHz at a center frequency sufficiently spaced apart from a main wave component. However, the center frequency of the first pilot signal $S_{P1}$ is in the same frequency band that of the main wave component belongs to. The second pilot signal generator 18 generates a second pilot signal $S_{P2}$ which is a set of two CW waves with a frequency spacing of approximately 1 kHz at a center frequency different from that of the first pilot signal. The center frequency of the second pilot signal $S_{P2}$ is in the same frequency band that of the main wave component belongs to. The first pilot signal $S_{P1}$ generated by the first pilot signal generator 9 is injected in the divider 11 through the directional coupler 8. The second pilot signal $S_{P2}$ generated by the second pilot signal generator 18 is injected in a main amplifier path $P_{MA}$ through the directional coupler 17. The pilot signals $S_{P1}$ and $S_{P2}$ are used for loop adjustment of the signal cancellation circuit 10 and the distortion eliminating circuit 20.

In particular, a directional coupler 45 extracts the first pilot signal $S_{P1}$ and a detector 42 detects the first pilot signal $S_{P1}$. A controller 43 adjusts a variable attenuator 12A and a variable phase shifter 12B of the vector adjuster 12 so as to reduce the detected first pilot signal $S_{P1}$ to a minimum. Similarly, a distortion component generated by the HRA 130 due to the injection of the second pilot signal $S_{P2}$ into the main amplifier path $P_{MA}$ through the directional coupler 17 is detected by the detector 42 from the signal extracted by a directional coupler 41. The controller 43 adjusts a variable attenuator 22A and a variable phase shifter 22B of the vector adjuster 22 so as to reduce the detected distortion component to a minimum.

Experimental Results

Figure 12:
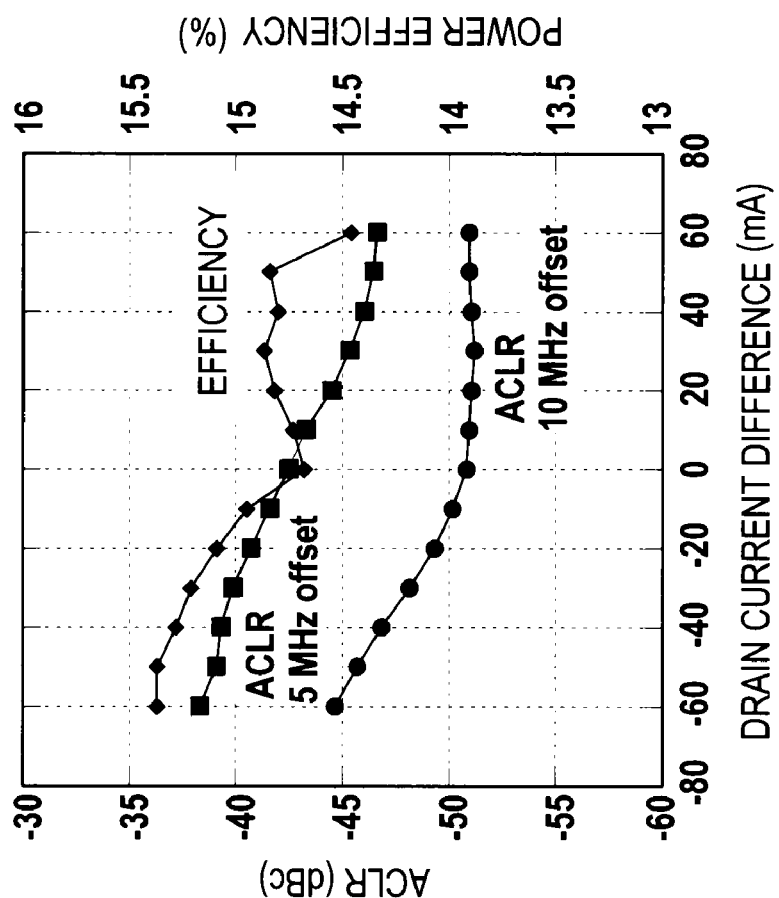
FIG. 12 is a graph showing measurements of power efficiency and ACLR of the feedforward amplifier in the second embodiment.

FIG. 12 shows results of an experiment on the feedforward amplifier 300 shown in FIG. 9. One W-CDMA wave with a center frequency of 2.14 GHz was used as an input signal for measurement conditions. In the initial state, gate bias voltages $V_{GB1}$ and $V_{GB2}$ were set such that drain currents of the two transistors 33A and 33B in the HRA 130 match each other. Then the gate bias voltages were changed to change the difference between the two drain currents and the ACLRs at offsets of 5 MHz and 10 MHz with respect to the current difference and the power efficiency of the feedforward amplifier 300 were measured. In control procedure, the vector adjusters 12 and 22 of the signal cancellation circuit 10 and the distortion eliminating circuit 20 were adjusted and gate bias voltages were controlled according to the procedure shown in FIG. 8.

As shown in FIG. 12, when the gate bias voltages are adjusted so that the drain current difference changes from a reference value (a drain current difference of 0 mA) to −50 mA, the power efficiency is improved by 0.7%. With the power efficiency improvement, the ACLR at an offset of 5 MHz degrades by 5 dB and the ACLR at an offset of 10 MHz degrades by 6 dB. These degradations can be compensated for by performing loop adjustments of the signal cancellation circuit 10 and the distortion eliminating circuit 20. When further loop adjustment of the signal cancellation circuit 10 and the distortion eliminating circuit 20 is not performed, the ACLR at an offset of 5 MHz was improved by −45 dBc and the power efficiency is improved by 0.3% by setting the drain current difference to 30 mA. Thus, the power efficiency can be improved by 0.3 to 0.7% by changing the gate bias voltages setting in the HRA 130.

Figure 13B:
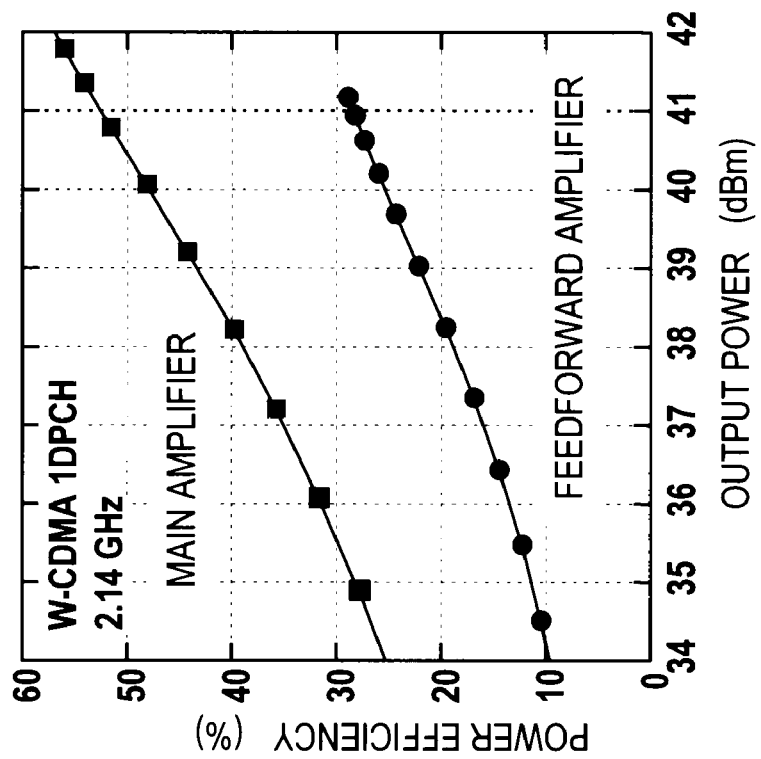
FIG. 13B is a graph showing the power efficiency of the feedforward amplifier in the second embodiment.
Figure 13A:
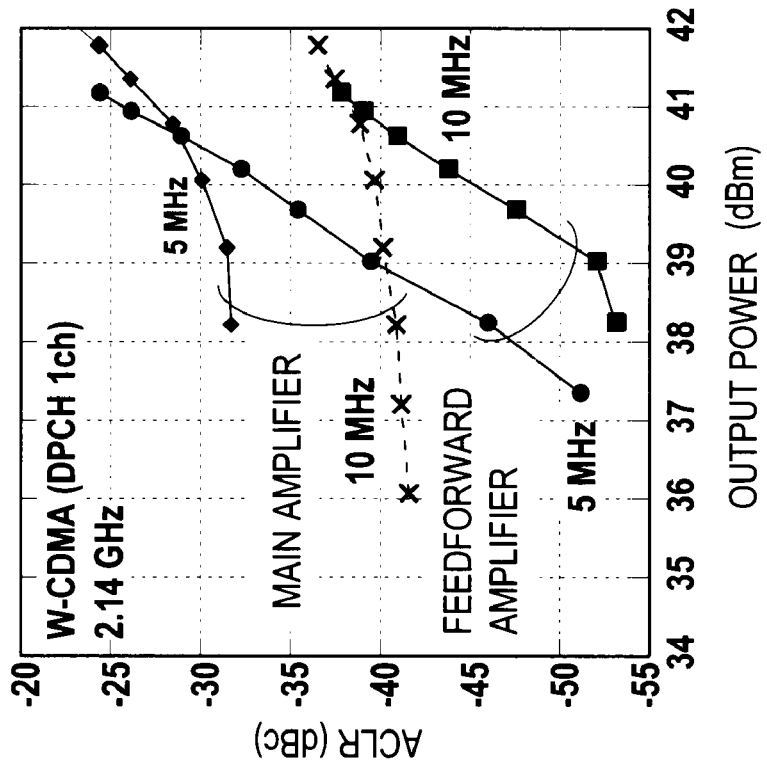
FIG. 13A is a graph showing measurements of ACLR versus output power of the feedforward amplifier in the second embodiment.

FIG. 13A shows the ACLR characteristic of the feedforward amplifier 300. Shown in FIG. 13A are measurements obtained by adjusting gate bias voltages to reduce the difference between the two drain currents shown in FIG. 12 to 0. FIG. 13A shows ACLRs at offsets of 5 MHz and 10 MHz in an output from the HRA 130, which is the main amplifier, and an output from the feedforward amplifier. The amount of distortion compensation is 13 dB at an ACLR of −45 dBc at an offset of 5 MHz. The output power of the feedforward amplifier is 38.4 dBm.

FIG. 13B shows power efficiency characteristics corresponding to FIG. 13A. The power efficiency of the HRA 130 as the main amplifier and that of the feedforward amplifier are shown. The feedforward amplifier has achieved a power efficiency of 19.8% at the output power of 38.4 dBm. Since the power efficiencies of conventional feedforward amplifiers are 15% and below, it can be seen that the feedforward amplifier according to the present invention is highly efficient.

As has been described above, according to the present invention, the power efficiency of the feedforward amplifier can be improved and the power consumption can be reduced. Consequently, the accompanying heat can be reduced, permitting the use of a smaller heatsink. Thus, size and weight reduction of the feedforward amplifier can be achieved.

What is claimed is:

1. A feedforward amplifier, comprising:
   a divider configured to distribute an input signal into a main amplifier path and a linear transfer path, the main amplifier path including a main amplifier which is a harmonic reaction amplifier;
   a combiner/divider configured to combine an output signal of the main amplifier path and an output signal of the liner transfer path to generate a signal input to a main amplifier output transfer path and a signal input to a distortion injection path including an auxiliary amplifier; and
   a power combiner configured to combine an output signal of the main amplifier output transfer path and an output signal of the distortion injection path and thereby outputting an output signal;
   a first directional coupler configured to extract a part of the output signal of the power combiner;
   a detector configured to detect, from the signal extracted by the first directional coupler, a main wave component which is the input signal input in the feedforward amplifier and upper and lower out-of-band distortion components generated by the main amplifier;

a power measuring part configured to measure an output power of the feedforward amplifier and supply power to the feedforward amplifier; and a controller configured to control an operating point of the harmonic reaction amplifier to maximize power efficiency calculated from the output power and the supply power under a condition that an adjacent channel leakage power ratio calculated from the detected main wave component and the detected upper and lower out-of-band distortion components are lower than or equal to a predetermined reference value.

2. The feedforward amplifier according to claim 1, wherein the harmonic reaction amplifier further comprises:

a second divider configured to divide a signal input in the harmonic reaction amplifier into two;

a first transistor having a gate to which one of the two signals distributed is provided and amplifying power;

a second transistor having a gate to which the other of the two signals distributed is provided and amplifying power;

a second-order harmonic termination circuit configured to terminate second harmonics between outputs of the first and second transistors;

a second power combiner configured to combine the powers of the two second-harmonic terminated signals to generate an output of the harmonic reaction amplifier; and first and second gate bias setting circuits configured to set, respectively, a gate bias voltage of the first transistor and a gate bias voltage of the second transistor in accordance with control by the controller.

3. The feedforward amplifier according to claim 2, wherein the harmonic reaction amplifier further comprises:

first and second drain bias setting circuits configured to set, respectively, a drain bias voltage of the first transistor and a drain bias voltage of the second transistor in accordance with control by the controller.

4. The feedforward amplifier according to any one of claims 1, 2 and 3, further comprising:

a first vector adjuster provided at the input side of the harmonic reaction amplifier in the main amplifier path;

a second vector adjuster provided on the input side of the auxiliary amplifier in the distortion injection path; and a second directional coupler provided on the input side of the second vector adjuster and configured to extract a part of a signal in the distortion injection path;

wherein the controller is configured to adjust the amount of attenuation and the amount of phase shift by the first vector adjuster to make the main wave component uniform and minimum on the basis of the signal extracted by the second directional coupler and is configured to adjust the amount of phase shift by the first vector adjuster and the amount of attenuation and the amount of phase shift by the second vector adjuster to minimize the power of the upper and lower out-of-band distortion components on the basis of the signal extracted by the first directional coupler.

5. A method for controlling a feedforward amplifier, the feedforward amplifier including a divider configured to distribute an input signal into a main amplifier path and a linear transfer path, the main amplifier path including a harmonic reaction amplifier as a main amplifier, a combiner/divider configured to combine an output signal of the main amplifier path and an output signal of the linear transfer path to generate a signal input to a main amplifier output transfer path and a signal input to a distortion injection path including an auxiliary amplifier, a power combiner configured to combine an output signal of the main amplifier output transfer path and an output signal of the distortion injection path and thereby outputting an output signal, a first directional coupler configured to extract a part of the output signal of the power combiner, and a controller configured to control an operating point of the harmonic reaction amplifier on the basis of the signal extracted by the first directional coupler, the harmonic reaction amplifier including a second divider configured to divide a signal input in the harmonic reaction amplifier into two, a first transistor having a gate to which one of the two signals distributed is provided and configured to amplify power, a second transistor having a gate to which the other of the two signals distributed is provided and configured to amplify power, a second-order harmonic termination circuit configured to terminate second harmonics between outputs of the first and second transistors, a second power combiner configured to combine the powers of the two second-harmonic terminated signals to generate an output of the harmonic reaction amplifier, and two gate bias setting circuits configured to set a gate bias voltage of the first transistor and a gate bias voltage of the second transistor in accordance with control by the controller, the control method comprising the step of:

detecting from the output signal of the feedforward amplifier a main wave component which is the input signal input in the feedforward amplifier and an out-of-band distortion component generated by the main amplifier and alternately controlling gate bias voltages of the first and second transistors of the harmonic reaction amplifier to maximize power efficiency of the feedforward amplifier under the condition that an adjacent channel leakage power ratio calculated from the main wave component and the out-of-band distortion component is a predetermined reference value or below.

6. The method according to claim 5, wherein the harmonic reaction amplifier further includes first and second drain bias setting circuits configured to set drain bias voltages of the first and second transistors according to control by the controller;

the method further comprising the step of:

detecting the main wave component and the out-of-band distortion component and alternately controlling the drain bias voltages of the first and second transistors of the harmonic reaction amplifier to maximize the power efficiency of the feedforward amplifier under the condition that an adjacent channel leakage power ratio calculated from the main wave component and the out-of-band distortion component is less than or equal to a predetermined reference value.

7. The method according to claim 5 or 6, further comprising the steps of:

adjusting the amount of attenuation and the amount of phase shift of a signal in the main amplifier path to make a main wave component in a signal output from the combiner/divider to the distortion injection path uniform and minimum;

adjusting the amount of phase shift of the signal in the main amplifier path to minimize the power of the out-of-band distortion component;

adjusting the amount of attenuation of the signal in the distortion injection path to minimize the power of the out-of-band distortion component;

adjusting the amount of phase shift of the signal in the distortion injection path to minimize the power of the out-of-band distortion component; and repeating the step of adjusting the amount of phase shift of the signal in the main amplifier path, the step of adjusting the amount of attenuation of the signal, and the step of adjusting the amount of phase shift of the signal in the distortion injection path, in turn, a plurality of times.

* * * * *